US010429229B2

(12) United States Patent
Saveliev et al.

(10) Patent No.: US 10,429,229 B2
(45) Date of Patent: Oct. 1, 2019

(54) ELECTRICAL DEVICE WITH A HOUSING HOLDING INSULATION OIL AND A SENSOR AND METHOD OF MONITORING THE DEVICE

(71) Applicant: Maschinenfabrik Reinhausen GmbH, Regensburg (DE)

(72) Inventors: Anatoli Saveliev, Zeitlarn (DE); Harald Hochmuth, Nittenau (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 137 days.

(21) Appl. No.: 15/504,869

(22) PCT Filed: Aug. 21, 2015

(86) PCT No.: PCT/EP2015/069243
§ 371 (c)(1),
(2) Date: Jun. 20, 2017

(87) PCT Pub. No.: WO2016/041735
PCT Pub. Date: Mar. 24, 2016

(65) Prior Publication Data
US 2017/0336243 A1 Nov. 23, 2017

(30) Foreign Application Priority Data
Sep. 18, 2014 (DE) .................. 10 2014 113 470

(51) Int. Cl.
*G01F 23/296* (2006.01)
*H01F 27/12* (2006.01)
(Continued)

(52) U.S. Cl.
CPC ...... *G01F 23/2965* (2013.01); *G01F 23/2967* (2013.01); *H01F 27/12* (2013.01);
(Continued)

(58) Field of Classification Search
CPC ............. G01F 23/2967; G01F 23/2965; G01R 31/1209; H01H 9/0044; H01H 2009/0061; H01F 27/12
See application file for complete search history.

(56) References Cited

U.S. PATENT DOCUMENTS 2,990,543 A * 6/1961 Rod ................. G01F 23/2961
340/621
3,110,890 A 11/1963 Westcott
(Continued)

FOREIGN PATENT DOCUMENTS

DE 3516200 A 11/1966
EP 0853236 A1 * 7/1998 ......... G01F 23/2967
(Continued)

OTHER PUBLICATIONS

Machine translation of DE 3516200 A1.*

*Primary Examiner* — David J Bolduc
(74) *Attorney, Agent, or Firm* — Andrew Wilford

(57) ABSTRACT

An electrical device (10, 13), in particular a power transformer (13), a shunt reactor, or an on-load tap changer (10), comprises
a housing (101, 131) that is filled or fillable with insulation oil (11, 11'); and
a sensor (12) that comprises
a piezo element (16) in the housing (101, 131) on a level with a minimum fill level (19, 19') of the insulation oil (11, 11'); and
an evaluation device (18) that is connected to the piezo element (16);
wherein
the evaluation device (18) is formed such that
it can induce an oscillation of the piezo element (16); and
(Continued)

it can determine the fill level from a measurement of a characteristic of the oscillation, in particular the half-life period of the amplitude of the oscillation.

18 Claims, 5 Drawing Sheets

(51) Int. Cl.
    *H01H 9/00*     (2006.01)
    *G01R 31/12*     (2006.01)

(52) U.S. Cl.
    CPC ....... *H01H 9/0044* (2013.01); *G01R 31/1209* (2013.01); *H01H 2009/0061* (2013.01)

(56) References Cited

U.S. PATENT DOCUMENTS

| | | | | |
|---|---|---|---|---|
| 4,144,517 A | * | 3/1979 | Baumoel | G01F 23/2961 367/93 |
| 4,203,324 A | * | 5/1980 | Baumoel | G01F 23/2961 367/908 |
| 4,964,090 A | * | 10/1990 | McCarthy | G01F 23/2961 310/334 |
| 5,195,058 A | * | 3/1993 | Simon | G01F 23/2962 340/621 |
| 5,777,550 A | * | 7/1998 | Maltby | G01F 23/284 324/727 |
| 5,836,192 A | * | 11/1998 | Getman | B06B 1/06 73/290 V |
| 5,943,294 A | * | 8/1999 | Cherek | G01F 23/2965 367/908 |
| 6,142,015 A | * | 11/2000 | Getman | G01F 23/2961 340/621 |
| 6,744,639 B1 | | 6/2004 | Branch et al. | |
| 6,774,639 B1 | * | 8/2004 | Unsworth | G01R 31/1227 324/535 |
| 7,081,757 B2 | | 7/2006 | Unsworth | |
| 2004/0046568 A1 | * | 3/2004 | Unsworth | G01R 31/1209 324/536 |
| 2011/0257924 A1 | * | 10/2011 | Bryant | H01F 27/402 702/122 |
| 2014/0133054 A1 | | 5/2014 | Carollo | |
| 2014/0230542 A1 | * | 8/2014 | Molitor | G01F 23/2961 73/290 V |
| 2014/0245834 A1 | * | 9/2014 | Urban | G01F 23/2965 73/584 |
| 2014/0366626 A1 | * | 12/2014 | Kuroda | G21C 17/035 73/290 V |

FOREIGN PATENT DOCUMENTS

| | | | |
|---|---|---|---|
| RU | 2205372 A | 5/2003 | |
| WO | WO-9853282 A1 * | 11/1998 | ......... G01F 23/2967 |

* cited by examiner

ELECTRICAL DEVICE WITH A HOUSING HOLDING INSULATION OIL AND A SENSOR AND METHOD OF MONITORING THE DEVICE

CROSS REFERENCE TO RELATED APPLICATIONS

This application is the US-national stage of PCT application PCT/EP2015/069243 filed 21 Aug. 2015 and claiming the priority of German patent application 102014113470.2 itself filed 18 Sep. 2014.

FIELD OF THE INVENTION

The invention relates to an electrical device with a housing filled with insulation oil, in particular to a power transformer, a shunt reactor, or an on-load tap changer, as well as to a sensor and a method of monitoring such an electrical device.

BACKGROUND OF THE INVENTION

RU 2 205 372 C1 describes a device for determining the fill level of a liquid in a container. This device comprises a piezoelectric transducer 1 that is acoustically coupled to the wall of the container, a first detector 2, a matching transformer 3, a first capacitor C1, an RF cable 4, a second capacitor C2, a sweep generator 5, a second detector 6, a third capacitor C3, an amplifier 7, two comparators 8 and 9, and a display unit 10. The center frequency of the sweep generator corresponds to the resonance if the wall thickness is a whole number of half-waves of the acoustic oscillations. Under this condition, the maximum amplitude of the oscillations of the circuit that consists of the secondary winding of the matching transformer and the capacitance of the piezoelectric element, is dependent on the presence or absence of liquid behind the wall. This known device is a very elaborate construction; it is inaccurate and temperature-dependent.

OBJECT OF THE INVENTION

The object of the invention is to reduce the temperature dependence of the monitoring and to increase the accuracy of the monitoring for an electrical device with a housing filled with insulation oil as well as for a sensor and a method of monitoring such an electrical device.

SUMMARY OF THE INVENTION

According to a first aspect of the invention, there is provided an electrical device comprising
  a housing filled or fillable with insulation oil; and
  a sensor that is formed, in particular, according to the second aspect; and/or
  a piezo element in the housing on a level with a minimum fill level of the insulation oil; and
  an evaluation device that is connected to the piezo element;
  where the evaluation device is formed such that
  it can induce an oscillation of the piezo element; and
  it can determine the fill level from a measurement of a characteristic of the oscillation, in particular the half-life period of the amplitude of the oscillation.

The electrical device proposed according to this aspect has a very simple construction, and it enables monitoring with great accuracy and little temperature dependence.

The proposed electrical device can be formed in any manner as required, for example
  as a power transformer or a shunt reactor or an on-load tap changer; and/or
  such that it comprises at least one or no additional sensor.

It can be provided that, for the purpose of monitoring the minimum fill level, the evaluation device is formed such that
  it compares the measurement value with a predetermined threshold value; and
  it generates an alarm signal if the measurement value is greater than the threshold value.

It can be provided that the evaluation device is outside of the housing or next to the housing.

It can be provided that, for the purpose of acoustically monitoring the electrical device, the evaluation device is formed such that
  it detects and, in particular, evaluates the oscillation of the piezo element at least during a part of the time interval in which the evaluation device is not inducing oscillation of the piezo element.

It can be provided that the piezo element is on the underside of a cover of the housing.

It can be provided that the sensor comprises an antenna in the housing and that is connected to the evaluation device.

It can be provided that, for the purpose of discharge monitoring, the evaluation device is formed such that
  it compares the amplitude of the antenna signal generated by the antenna with a predetermined threshold value; and
  it generates an alarm signal if the amplitude is greater than the threshold value.

It can be provided that, for the purpose of discharge localization, the evaluation device is formed such that
  it compares the amplitude of the antenna signal generated by the antenna with a predetermined threshold value and, in particular, detects the antenna signal; and
  it detects and, in particular, evaluates the oscillation of the piezo element if the amplitude of the antenna signal is greater than the threshold value, and, in particular, also evaluates the antenna signal.

It can be provided that the evaluation device is formed such that
  it compares the amplitude of the oscillation with a predetermined threshold value; and,
  if the amplitude of the oscillation is greater than the threshold value, it determines a running time as difference between the moment when the amplitude of the oscillation is greater than the associated threshold value and the moment when the amplitude of the antenna signal is greater than the associated threshold value, and it generates a localization signal from the running time.

It can be provided that the oscillation induced in the piezo element is carried out at its resonant frequency.

It can be provided that the sensor comprises at least one temperature sensor in the housing and connected to the evaluation device.

Each electrical device can be formed in any manner as required and comprise, for example, at least one or no additional housing and/or at least one or no additional sensor.

According to a second aspect of the invention, there is provided a sensor for monitoring an electrical device that comprises a housing filled or fillable with insulation oil and that is, in particular, formed according to the first aspect, the sensor comprising a piezo element that can be in the housing on a level with a minimum fill level of the insulation oil; and an evaluation device that is connected to the piezo element;

where the evaluation device is formed such that it can induce an oscillation of the piezo element; and it can determine the measurement value of a measurand of the oscillation, in particular the half-life of the amplitude of the oscillation, with the measurand being dependent on the fill level.

The sensor proposed according to this aspect has a very simple construction and it enables monitoring with great accuracy and little temperature dependence.

Each piezo element can be formed in any manner as required, for example as a disk or foil or hollow cylinder or thin film; and/or such that it is manufactured at any rate from at least one piezoelectric ceramics, such as, for example, aluminum nitride or barium titanate or lead zirconate titanate (PZT), and/or at least one piezoelectric crystal, such as, for example, quartz or lithium niobate or gallium orthophosphate, and/or at least one piezoelectric plastic, such as, for example, polyvinylidene fluoride (PVDF), and/or zinc oxide.

It can be provided that, for the purpose of monitoring the minimum fill level, the evaluation device is formed such that it compares the measurement value with a predetermined first threshold value; and it generates an alarm signal if the measurement value is greater than the threshold value.

It can be provided that the evaluation device can be outside of the housing or next to the housing.

It can be provided that the sensor comprises a cable by which the evaluation device is connected to the piezo element.

It can be provided that, for the purpose of acoustically monitoring the electrical device, the evaluation device is formed such that it detects and, in particular, evaluates the oscillation of the piezo element at least during a part of the time interval in which the evaluation device is not inducing oscillation of the piezo element.

It can be provided that the piezo element can be on the underside of a cover of the housing.

It can be provided that the sensor comprises an antenna that can be in the housing and that is connected to the evaluation device.

It can be provided that, for the purpose of discharge monitoring, the evaluation device is formed such that it compares the amplitude of the antenna signal generated by the antenna with a predetermined threshold value; and it generates an alarm signal if the amplitude is greater than the threshold value.

It can be provided that, for the purpose of discharge localization, the evaluation device is formed such that it compares the amplitude of the antenna signal generated by the antenna with a predetermined threshold value and, in particular, detects the antenna signal; and it detects and, in particular, evaluates the oscillation of the piezo element if the amplitude of the antenna signal is greater than the threshold value, and, in particular, also evaluates the antenna signal.

It can be provided that the evaluation device is formed such that it compares the amplitude of the oscillation with a predetermined threshold value; and, if the amplitude of the oscillation is greater than the threshold value, it determines a running time as difference between the moment when the amplitude of the oscillation is greater than the associated threshold value and the moment when the amplitude of the antenna signal is greater than the associated threshold value, and it generates a localization signal from the running time.

It can be provided that the oscillation inducement of the piezo element is carried out at its resonant frequency.

It can be provided that the sensor comprises a temperature sensor that can be in the housing and that is connected to the evaluation device.

It can be provided that the piezo element is arranged or accommodated together with the antenna and/or with the temperature sensor in a common measuring housing.

It can be provided that the piezo element has an upper side that is at least partly convex and/or that is at least partly planar and not horizontal and/or that is at least partly planar and horizontal and/or that is at least partly concave and/or that has at least or exactly one outlet for insulation oil.

If the minimum fill level is reached or fallen below of, the insulation oil potentially still remaining or standing on the top side of the piezo element can exit through the outlet. The outlet can be formed in any manner as required and can comprise, for example, at least or exactly one outlet opening and/or at least or exactly one outlet hole and/or at least or exactly one outlet groove and/or at least or exactly one outlet slot.

Preferably, at least one of the antennas and/or at least one of the temperature sensors is in the immediate vicinity of at least one of the piezo elements or is on at least one of the piezo elements.

According to a third aspect of the invention, there is provided a method of monitoring an electrical device with the electrical device being formed according to the first aspect and/or comprising a housing filled or fillable with insulation oil and a sensor that is formed according to the second aspect; and/or a piezo element in the housing on a level with a minimum fill level of the insulation oil;

the method comprising the steps that an oscillation of the piezo element is induced; and the measurement value of a measurand of the oscillation is determined, in particular the half-life of the amplitude of the oscillation, with the measurand being dependent on the fill level.

The method proposed according to this aspect enables monitoring with great accuracy and little temperature dependence.

It can be provided that, for the purpose of monitoring the minimum fill level, the measurement value is compared with a predetermined threshold value; and an alarm signal is generated if the measurement value is greater than the threshold value.

It can be provided that, for the purpose of acoustically monitoring the electrical device, the oscillation of the piezo element is detected and, in particular, evaluated at least during a part of the time interval in which the piezo element is not being induced to oscillate.

It can be provided that the sensor comprises an antenna in the housing;

that, for the purpose of discharge monitoring, the amplitude of the antenna signal generated by the antenna is compared with a predetermined threshold value; and an alarm signal is generated if the amplitude is greater than the threshold value.

It can be provided that, for the purpose of discharge localization, the amplitude of the antenna signal generated by the antenna is compared with a predetermined threshold value and, in particular, the antenna signal is detected; and the oscillation of the piezo element is detected and, in particular, evaluated if the amplitude of the antenna signal is greater than the threshold value, and, in particular, the antenna signal is also evaluated.

It can be provided that the amplitude of the oscillation is compared with a predetermined threshold value; and if the amplitude of the oscillation is greater than the threshold value, a running time is determined as difference between the moment when the amplitude of the oscillation is greater than the associated threshold value and the moment when the amplitude of the antenna signal is greater than the associated threshold value, and a localization signal is generated from the running time.

It can be provided that the oscillation inducement of the piezo element is carried out at its resonant frequency.

Each of the proposed electrical devices and sensors can be used to carry out, for example, one of the proposed methods.

Preferably, each of the proposed electrical devices and sensors can be formed to and/or serve to and/or be suitable to carry out or to be able to carry out one of the proposed methods.

Each sensor can be formed in any manner as required and comprise, for example, at least one or no additional piezo element and/or at least one or no additional evaluation device and/or at least one or no additional cable and/or at least one or no additional antenna and/or at least one or no additional temperature sensor.

Each piezo element can be formed in any manner as required, for example such that it has a resonant frequency between 100 kHz and 10 MHZ or between 200 kHz and 5 MHZ or between 500 kHz and 2 MHZ or between 700 kHz and 1.5 MHZ or from 500 kHz or from 750 kHz or from 1 MHZ or from 1.5 MHZ or from 2 MHZ or from 3 MHZ or from 5 MHZ.

The oscillation inducement of the piezo element can be carried out in any manner as required, for example with at least one burst signal of which the main frequency corresponds to the resonant frequency of the piezo element and/or with at least one burst signal of which the main frequency does not correspond to the resonant frequency of the piezo element and/or with at least one Dirac pulse and/or with at least one rectangular pulse and/or with at least one wideband signal that contains the resonant frequency and/or at least one other frequency.

The main frequency of the burst signal can be selected as required and deviate upward or downward from the resonant frequency by a predetermined difference or by a predetermined ratio, for example. Preferably, the predetermined difference is greater than or equal to a value amounting to 10 kHz or 20 kHz or 50 kHz or 100 kHz or 200 kHz or 500 kHz, for example. Preferably, the predetermined ratio is greater than or equal to a first value and/or less than or equal to a second value, and the first value amounts to, for example, 5% or 7% or 10% or 15% or 20% or 35%, and the second value amounts to, for example, 5% or 7% or 10% or 15% or 20% or 35%.

Each cable can be formed in any manner as required, as a twisted pair cable, for example, and/or it can comprise at least or exactly two cores, for example, and/or it can be at least 3 m or at least 4 m or at least 5 m or at least 6 m or at least 8 m or at least 10 m long or at least 15 m long or at least 20 m long or at least 30 m long, for example.

Each antenna can be formed in any manner as required, for example as an electrical antenna or as a magnetic antenna or as a ferrite rod antenna or as a dipole antenna, and/or it can comprise at least or exactly one coil and/or at least or exactly one capacitor, for example.

Each comparison of the amplitude can be carried out in any manner as required, for example such that the amplitude can be compared with at least one additional predetermined threshold value.

The explanations and exemplifications regarding one of the aspects of the invention, in particular regarding individual features of this aspect, also apply correspondingly for the other aspects of the invention.

BRIEF DESCRIPTION OF THE DRAWING

In the following, embodiments of the invention are explained in detail by means of the attached drawings. The individual features thereof are, however, not limited to the individual embodiments but can be connected and/or combined with individual features described further above and/or with individual features of other embodiments. Each example in the illustrations is provided by way of explanation, not limitation of the invention. The reference characters included in the claims are by no means intended to limit the scope of protection, but rather merely refer to the embodiments shown in the figures, in which

SPECIFIC DESCRIPTION OF THE INVENTION

Figure 1:
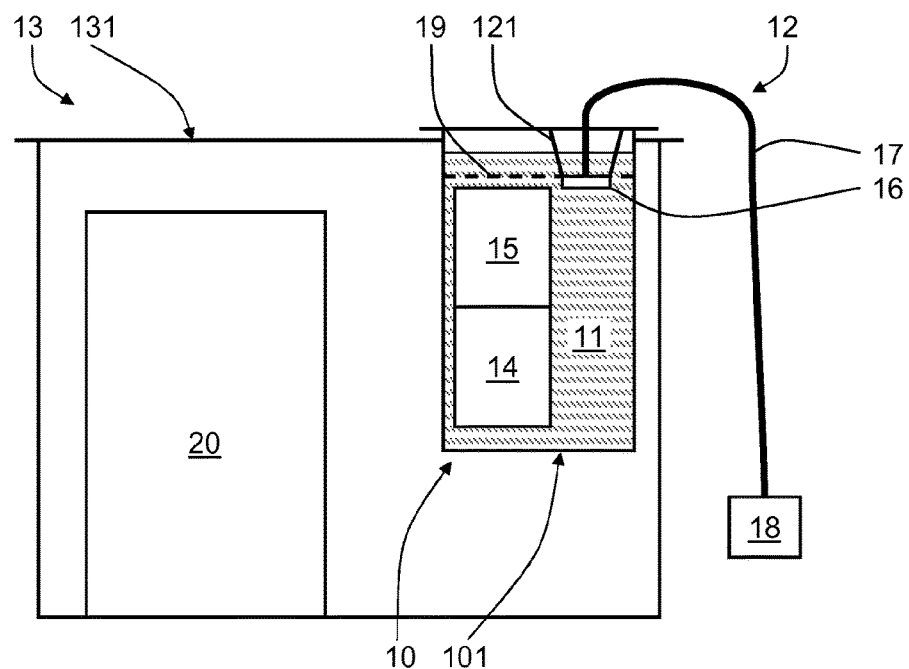
FIG. 1 shows a first embodiment of an electrical device with a housing filled with insulation oil and with a first embodiment of a sensor.

In FIG. 1, a first embodiment of an electrical device 10 is schematically illustrated, the electrical device 10 comprising a housing 101 filled or fillable with insulation oil 11, and comprising a sensor 12, and exemplarily forming an on-load tap changer 10 for a power transformer 13.

In this embodiment, the electrical device or the on-load tap changer 10, as the case may be, comprises a selector 14 in a lower area within the housing 101, also termed switch housing 101 in the following, and a load diverter switch 15 in an upper area within the switch housing 101. Preferably, the on-load tap changer 10 is formed as a load selector in which the selector 14 and the load diverter switch 15 are integrated into one load selector component.

The sensor 12 is formed according to a first embodiment. In this embodiment, the sensor 12 comprises a measuring housing 121, a piezo element 16, a cable 17, and an evaluation device 18 that is connected to the piezo element 16 by the cable 17. The piezo element 16 is in the switch housing 101 on a level with a minimum fill level 19 of the insulation oil 11 and exemplarily has a resonant frequency of 1 MHZ. The measuring housing 121 is at the underside of a cover of the switch housing 101 with its top end; it accommodates the piezo element 16 in its bottom end, and it is oil-permeable, such that the insulation oil 11 can surround the piezo element 16 at least partly and preferentially as completely as possible when there is a sufficient fill level. The measuring housing 121 has, for example, several openings for the insulation oil 11 and/or comprises a frame of interconnected rods and/or at least one lattice and/or at least one mesh.

The cable 17 exemplarily is a shielded twisted pair cable (STP cable), exemplarily with at least two, in particular with exactly two cores; and the evaluation device 18 is exemplarily next to the transformer housing 131 and thus next to the switch housing 101.

The evaluation device 18 is formed such that it can induce an oscillation of the piezo element 16 and determine the half-life of the amplitude of the oscillation. The half-life depends on the attenuation of the oscillation. The attenuation depends on the medium that is adjacent to the piezo element 16, the medium being the insulation oil 11 in a first instance where the surface of the insulation oil 11 in the switch housing 101 is on a level with or above the minimum fill level 19, and the medium being at least partly air in a second instance where the surface of the insulation oil 11 is below the minimum fill level 19. As the insulation oil 11 has a greater density compared to air, the attenuation is greater in the first instance than in the second instance. The half-life is therefore less in the first instance than in the second instance and consequently depends on the fill level. The half-life thus exemplarily represents a measurement value of a measurand of the oscillation with the measurand being dependent on the fill level.

For the purpose of monitoring the minimum fill level 19, the evaluation device 18 is formed such that it compares the measurement value exemplarily with exactly one predetermined first threshold value, and it generates a corresponding first alarm signal if the measurement value is greater than the threshold value. This is exemplarily carried out in that the evaluation device 18 compares the half-life with a predetermined first threshold value and generates the first alarm signal if the half-life is greater than the threshold value. The first threshold value here corresponds to the half-life of an oscillation of the piezo element 16 of which the surface at least partly and, in particular, completely, is not adjacent to insulation oil 11, but rather to air.

The oscillation inducement is exemplarily carried out by way of a burst signal of which the frequency corresponds to the resonant frequency of the piezo element 16.

Figure 2:
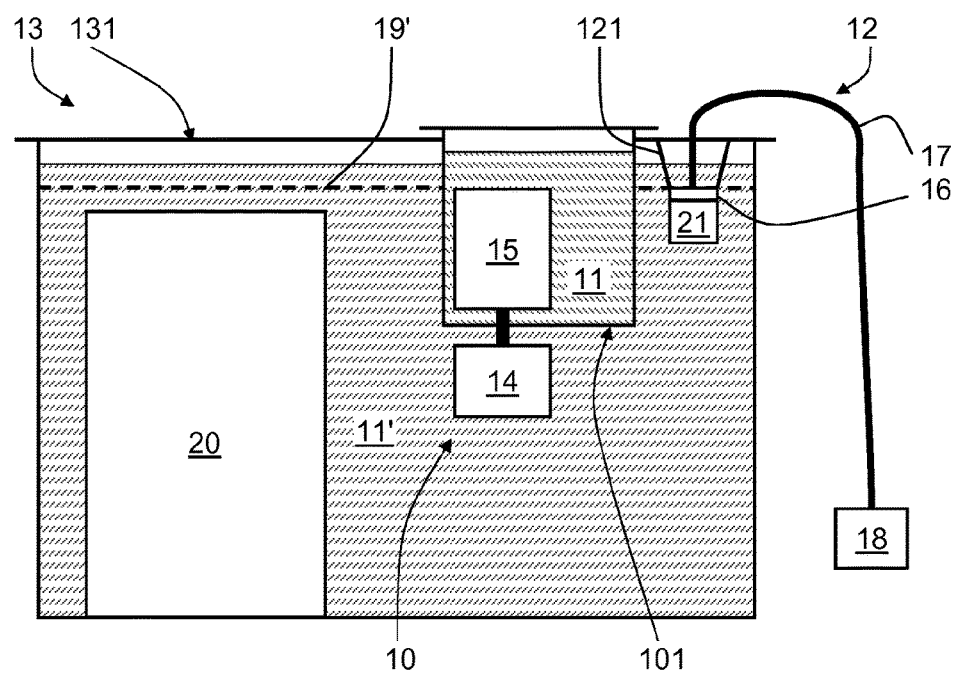
FIG. 2 shows a second embodiment of the electrical device with a second embodiment of the sensor.
Figure 3:
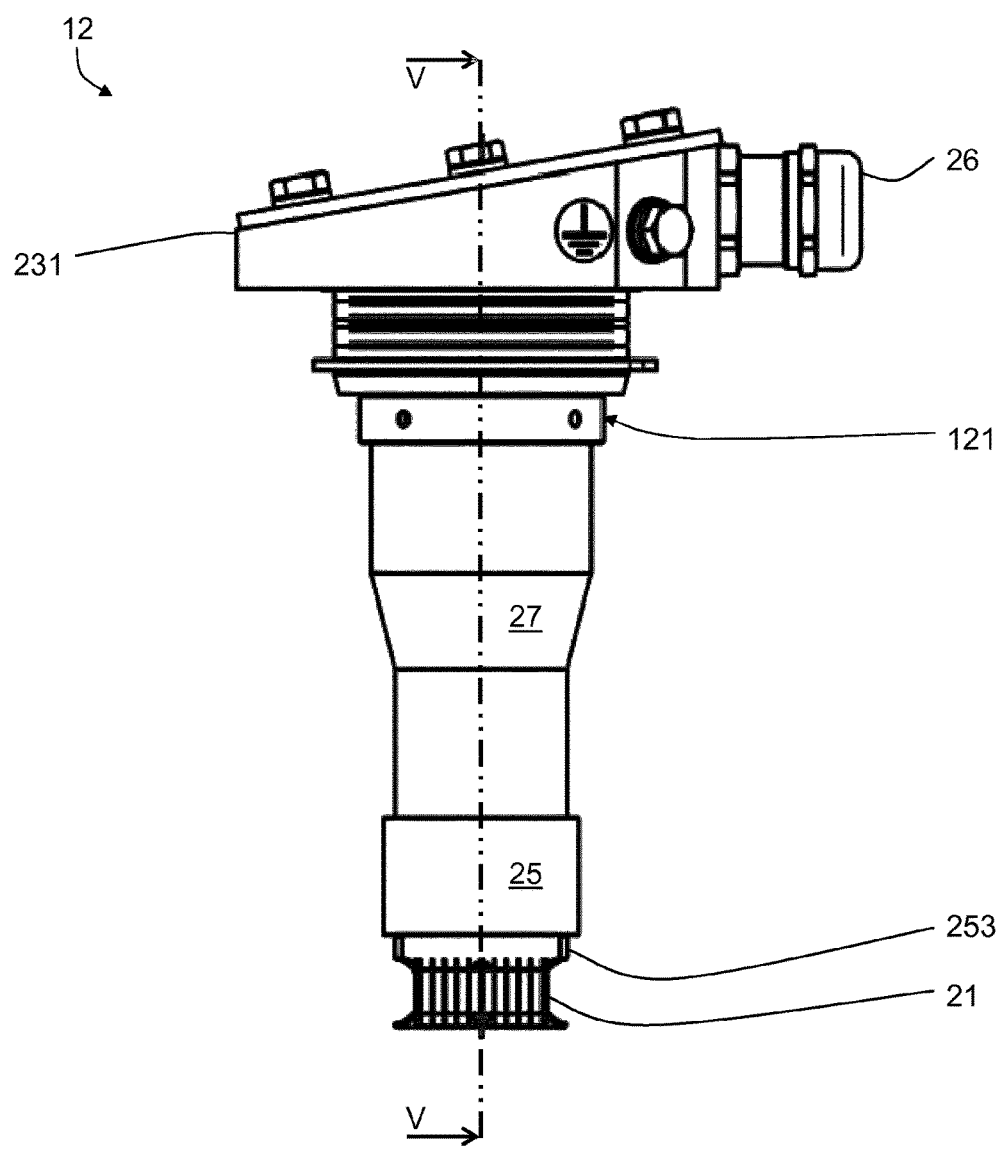
FIG. 3 shows a part of a third embodiment of the sensor in a side view.

Schematically illustrated in FIG. 2 is a second embodiment of the electrical device 13 that comprises a housing 131 filled or fillable with insulation oil 11', a sensor 12, and an active part 20 with a non-illustrated core and with non-illustrated windings, the electrical device 13 exemplarily forming a power transformer 13. As this embodiment is similar to the first embodiment, primarily the differences will be explained in more detail in the following passages.

In this embodiment, the electrical device or the power transformer 13, as the case may be, comprises the on-load tap changer 10 in a first area within the housing 131 that is also termed transformer housing 131 in the following. The active part 20 is in a second area within the transformer housing 131. The first area is adjacent to a first side wall (on the right in FIG. 2) of the transformer housing 131, the second area is adjacent to a second side wall (on the left in FIG. 2), facing the first side wall, of the transformer housing 131.

The on-load tap changer 10 is formed as a load switch with the selector 14 and the load diverter switch 15 forming separate units that are connected to each other mechanically by way of a switching shaft and electrically by way of non-illustrated connecting cables. The selector 14 is not within the switch housing 101 as in the first embodiment, but rather outside of the switch housing 101 and within the transformer housing 131; and the switching shaft and the non-illustrated connecting cables are routed through the switch housing 101 into the transformer housing 131.

The sensor 12 is formed according to a second embodiment. As this embodiment is similar to the first embodiment, primarily the differences will be explained in more detail in the following passages.

In this embodiment, the piezo element 16 is in the transformer housing 131 in the second area between the on-load tap changer 10 and the second side wall on a level with a minimum fill level 19' of the insulation oil 11'. The measuring housing 121 is at the underside of a cover of the transformer housing 131 with its top end, and it is oil-permeable, such that the insulation oil 11' can surround the piezo element 16 at least partly and preferentially as completely as possible when there is a sufficient fill level.

The sensor 12 comprises an antenna 21 that is exemplarily at the measuring housing 121 below the piezo element 16 and connected to the evaluation device 18 by the cable 17. Accordingly, the cable 17 exemplarily comprises at least two, in particular exactly two additional cores for the antenna 21.

For the purpose of acoustically monitoring the power transformer 13, the evaluation device 18 is formed such that the oscillation of the piezo element 16 is detected and evaluated at least during a part of the time interval in which the evaluation device 18 is not inducing oscillation of the piezo element 16. The piezo element 16 then serves as a microphone for the acoustic waves that are generated in the power transformer 13 and transmitted by way of the insulation oil 11' and that cause the oscillation.

For the purpose of discharge monitoring, the evaluation device 18 is formed such that it compares the amplitude of the antenna signal generated by the antenna 21 with a predetermined second threshold value and, if the amplitude is greater than the threshold value, generates a corresponding second alarm signal that indicates a low probability for a discharge in the power transformer 13.

The evaluation device 18 is moreover formed such that it detects the oscillation of the piezo element if the amplitude is greater than the second threshold value. The detection of the oscillation is carried out without previous oscillation inducement of the piezo element 16 such that the piezo element 16 serves as a microphone for the acoustic waves that are generated in the power transformer 13 and transmitted by way of the insulation oil 11' and that cause the oscillation. If the amplitude of the oscillation is greater than a third threshold value, the evaluation device 18 will determine a running time of the acoustic waves as a difference between the moment when the amplitude of the oscillation is greater than the third threshold value and the moment when the amplitude of the antenna signal is greater than the second threshold value. If the running time is within a predetermined interval that depends on the position of the piezo element 16 and on the dimensions of the power transformer 13, the evaluation device 18 will generate a third alarm signal that indicates a high probability for a discharge in the power transformer 13.

For the purpose of discharge localization, the evaluation device 18 is formed such that it compares the amplitude of the antenna signal generated by the antenna 21 with a predetermined fourth threshold value and, if the amplitude is greater than the threshold value, detects the oscillation of the piezo element. The detection of the oscillation is carried out without previous oscillation inducement of the piezo element 16. If the amplitude of the oscillation is greater than a fifth threshold value, the evaluation device 18 will determine a running time of the acoustic waves as a difference between the moment when the amplitude of the oscillation is greater than the fifth threshold value and the moment when the amplitude of the antenna signal is greater than the fourth threshold value. If the running time is within a predetermined first interval that depends on the distance between the piezo element 16 and a potential first discharge source within the power transformer 13, the evaluation device 18 will generate a first localization signal that indicates a discharge at the first discharge source. If the running time is within a predetermined second interval that depends on the distance between the piezo element 16 and a potential second discharge source within the power transformer 13, the evaluation device 18 will generate a second localization signal that indicates a discharge at the second discharge source. Exemplarily, the first discharge source is the selector 14, and the second discharge source is the active part 20. As the active part 20 is spaced further apart from the piezo element 16 than from the selector 14 in this embodiment, the lower limit of the second interval is selected to be greater than or equal to the upper limit of the first interval.

A part of a third embodiment of the sensor 12 is schematically illustrated in FIG. 3, FIG. 4, FIG. 5, and FIG. 6. As this embodiment is similar to the second embodiment, primarily the differences will be explained in more detail in the following passages.

The antenna 21 in this embodiment exemplarily comprises a coil, and the sensor 12 comprises a temperature sensor 22 that is exemplarily at the measuring housing 121 above the piezo element 16 and connected to the evaluation device 18 by the non-illustrated cable 17. Accordingly, the cable 17 exemplarily comprises at least two, in particular exactly two additional cores for the temperature sensor 22.

The measuring housing 121 is exemplarily formed in three parts and comprises an upper housing part 23 (at the top of FIG. 4) with a housing head 231 at its top end, an essentially tubular middle housing part 24 (in the center of FIG. 4), and an essentially tubular lower housing part 25 (at the bottom of FIG. 4) with a circular collar 251, at least one tooth-like stop 252, and an antenna holder 253. The housing parts 23-25 are electrically insulating.

The upper housing part 23 is passed through the non-illustrated cover of the transformer housing 131 and fastened thereto such that the essentially tubular lower end section of the upper housing part 23 is within the transformer housing 131 and the housing head 231 is outside of the transformer housing 131. The housing head 231 comprises a cable bushing 26 for the cable 17. The temperature sensor 22 runs through the lower end section of the upper housing part 23.

The sensor 12 comprises an outer shielding member 27, two inner shielding members 28, two wedge-shaped retaining rings 29, two O-rings 30, and a support ring 31. The outer shielding member 27 exemplarily comprises a tube or a hose of an electrically conductive lattice or mesh, and it is therefore oil-permeable. With its upper end, it is fastened at the upper end of the lower end section of the upper housing part 23 and accommodates the end section with its upper end section; and it accommodates the middle housing part 24 with its lower end section. The middle housing part 24 accommodates, in this sequence, the first inner shielding member 28, the first retaining ring 29, the first O-ring 30, the piezo element 16, the second O-ring 30, the second retaining ring 29, the second inner shielding member 28, and the support ring 31 (from top to bottom in FIG. 4, 5). Exemplarily, the lower housing part 25 has a circular cylindrical peripheral wall and, at its bottom edge, the radially inwardly projecting collar 251. The stop 252 projects radially from the inner edge of the collar 251. The antenna holder 253, at which the coil of the antenna 21 is fastened, projects axially downward from the lower end of the peripheral wall. The lower housing part 25 accommodates the lower end section of the outer shielding member 27.

Figure 4:
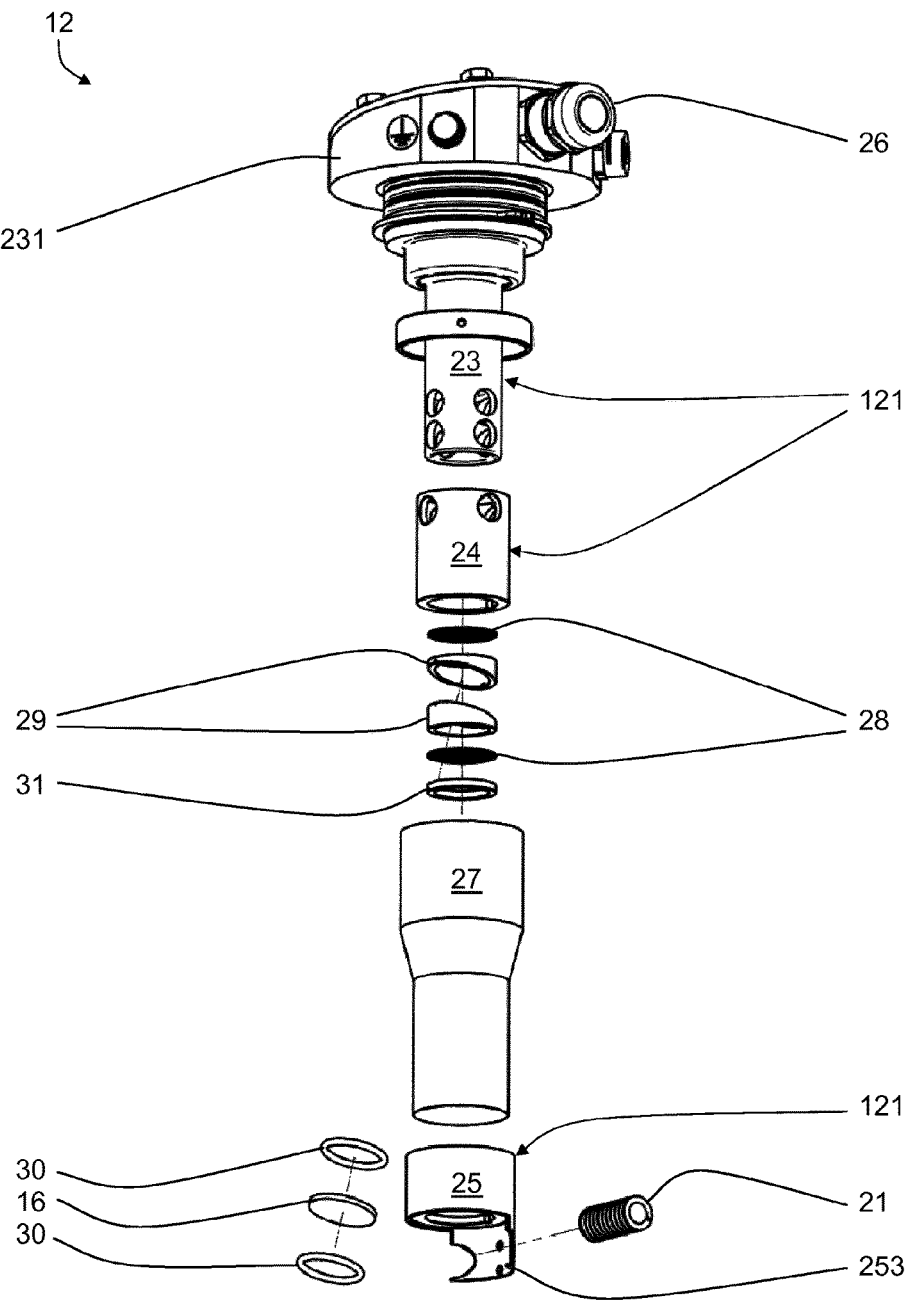
FIG. 4 is an exploded view of FIG. 3.
Figure 5:
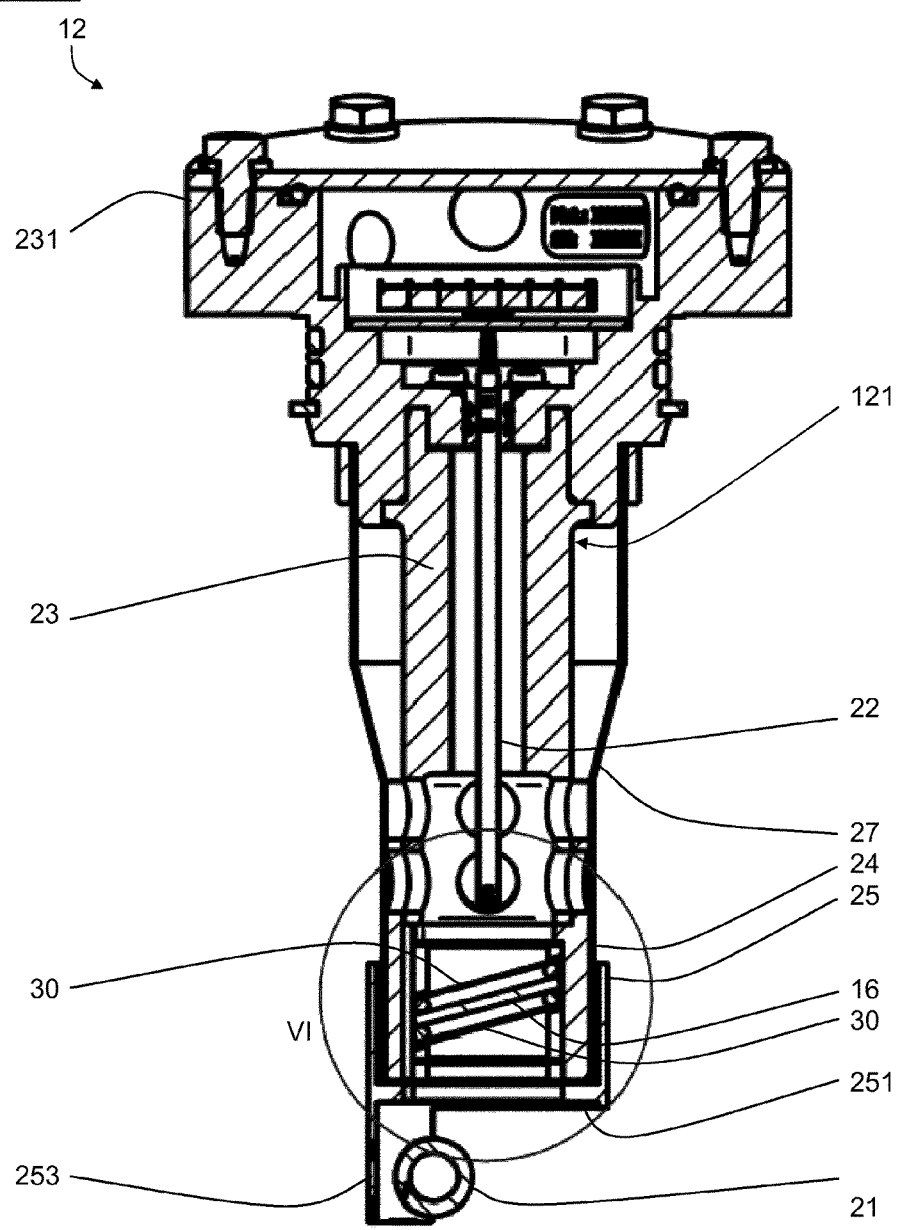
FIG. 5 is a section along the line V-V of FIG. 3.
Figure 6:
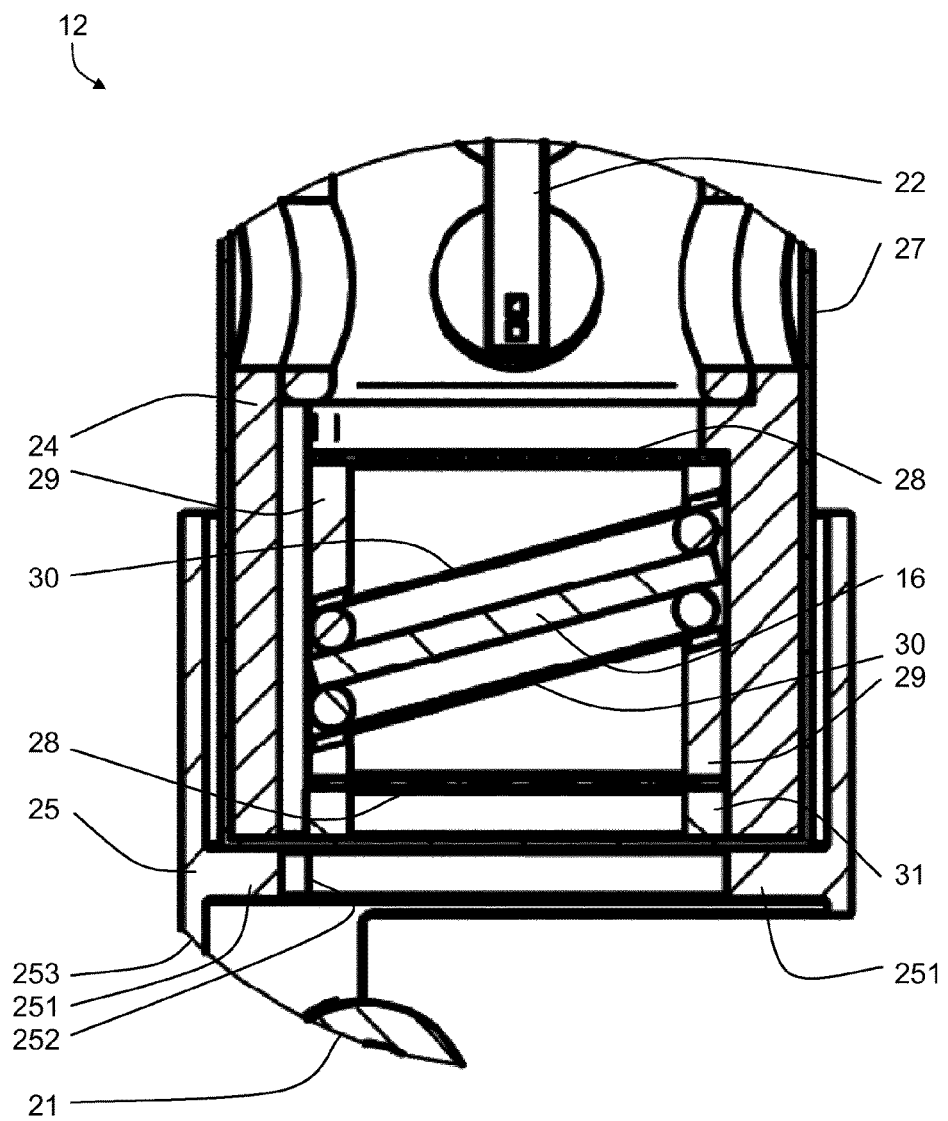
FIG. 6 shows the enlarged detail VI of FIG. 5.

Exemplarily, the piezo element 16 is a circular disk and thus has a planar upper side and a planar underside. The first O-ring 30 abuts on the upper side, and the second O-ring 30 abuts on the underside. Each retaining ring 29 exemplarily has a circular cylindrical, outer peripheral surface, a circular, first end face and an elliptical, second end face such that it looks like a wedge from the side (FIG. 4-6). With its second end face, each retaining ring 29 abuts on the respective O-ring 30. Each inner shielding member 28 exemplarily comprises a circular disk or a circular plate of an electrically conductive lattice or mesh, and it is therefore oil-permeable. With one side, it abuts on the first end face of the respective retaining ring 29. With its other side, that is to say with the upper side, the first inner shielding member 28 abuts on the lower end face of the lower end section of the upper housing part 23. The support ring 31 exemplarily has a circular cylindrical, outer peripheral surface and two circular end faces. With its other side, that is to say with the underside, the second inner shielding member 28 abuts on the upper end face of the support ring 31. With its lower end face, the support ring 31 abuts on the stop 252. With its lower end face, the middle housing part 24 abuts on the collar 251.

As the piezo element 16 is wedged in between the elliptical, second end faces of the retaining rings 29 in a slanting position, its upper side is not horizontal when the piezo element 16 is properly built into the measuring housing 121 and the measuring housing 121 is properly built into the power transformer 13. At its lowest point, the first O-ring 30 preferentially has a non-illustrated slot that forms an outlet for insulation oil 11', through which the insulation oil 11' potentially remaining on the top side of the piezo element 16 can exit if the minimum fill level 19' is reached or fallen below of.

Alternatively or additionally, the piezo element 16 itself can have an outlet for insulation oil 11', which can exemplarily be an outlet opening, an outlet hole, an outlet groove, or an outlet slot. Alternatively or additionally, a toothed disk with teeth projecting axially to the piezo element 16 can be between the piezo element 16 and the first O-ring 30 such that the insulation oil 11' can exit between the teeth of the toothed disk.

The invention claimed is:

1. An electrical device comprising:
   a housing filled or fillable with insulation oil;
   a sensor having a piezo element in the housing on a level with a minimum fill level of the insulation oil; and
   an evaluation device that is connected to the piezo element and that
   induces an oscillation of the piezo element by a burst signal followed by a time interval in which no oscillation is induced by the evaluation device;
   determines the fill level from a measurement of a characteristic of the oscillation by the burst signal, and acoustically monitors the electrical device by recording the oscillation during at least part of the time in which the piezo element is not induced to oscillate.

2. The electrical device according to claim 1, wherein, for the purpose of monitoring the minimum fill level, the evaluation device
    compares the measurement value with a predetermined threshold value and
    generates an alarm signal if the measurement value is greater than the threshold value.

3. The electrical device according to claim 1, wherein the evaluation device is outside of the housing or next to the housing.

4. The electrical device according to claim 1, wherein the piezo element is on the underside of a cover of the housing.

5. The electrical device according to claim 1, wherein the sensor has an antenna in the housing and connected to the evaluation device.

6. The electrical device according to claim 5, wherein, for the purpose of discharge monitoring, the evaluation device
    compares the amplitude of the antenna signal generated by the antenna with a predetermined threshold value; and
    generates an alarm signal if the amplitude is greater than the threshold value.

7. The electrical device according to claim 5, wherein, for the purpose of discharge localization, the evaluation device
    compares the amplitude of the antenna signal generated by the antenna with a predetermined threshold value; and
    detects the oscillation of the piezo element if the amplitude of the antenna signal is greater than the threshold value.

8. The electrical device according to claim 7, wherein the evaluation device
    compares the amplitude of the oscillation with a predetermined threshold value; and,
    if the amplitude of the oscillation is greater than the threshold value, determines a running time as difference between the moment when the amplitude of the oscillation is greater than the associated threshold value and the moment when the amplitude of the antenna signal is greater than the associated threshold value, and it generates a localization signal from the running time.

9. The electrical device according to claim 1, wherein the inducement of oscillation of the piezo element is carried out at its the resonant frequency of the piezo element.

10. A sensor for monitoring an electrical device comprising:
    a housing filled or fillable with insulation oil;
    a sensor having a piezo element in the housing on a level with a minimum fill level of the insulation oil; and
    an evaluation device that is connected to the piezo element and that induces an oscillation of the piezo element by a burst signal followed by a time interval in which no oscillation is induced by the evaluation device; determines the fill level from a measurement of a characteristic of the oscillation by the burst signal; and acoustically monitors the electrical device by recording the oscillation during at least part of the time in which the piezo element is not induced to oscillate.

11. The sensor according to claim 10, the sensor comprising
    a temperature sensor that can be in the housing and that is connected to the evaluation device.

12. The sensor according to claim 11, further comprising:
    an antenna in the housing; and
    a common housing holding the piezo element together with the antenna and the temperature sensor.

13. The sensor according to claim 10, wherein
    the piezo element has an upper side that is at least partly convex or that is at least partly planar and not horizontal or that is at least partly planar and horizontal or that is at least partly concave or that has at least or exactly one outlet for insulation oil.

14. A method of monitoring an electrical device that comprises
    a housing filled or fillable with insulation oil; and
    a sensor that has a piezo element in the housing on a level with a minimum fill level of the insulation oil;
    the method comprising the steps of:
    inducing an oscillation of the piezo element by applying to the burst signal followed by a time interval during which no oscillation is induced in the piezo element; and
    determining the fill level from a measurement of the half-life period of the amplitude of the oscillation y acoustically monitoring the piezo element and during oscillation by the burst signal and during the time interval thereafter.

15. The method according to claim 14, further comprising the steps, for the purpose of monitoring the minimum fill level, of:
    comparing the measurement with a predetermined threshold value; and
    generating an alarm signal if the measurement is greater than the threshold value.

16. The method according to claim 14, wherein the sensor comprises an antenna in the housing, the method comprising, for the purpose of discharge monitoring, the steps of:
    comparing the amplitude of the antenna signal generated by the antenna with a predetermined threshold value; and
    generating an alarm signal if the amplitude is greater than the threshold value.

17. The method according to claim 16, further comprising, for the purpose of discharge localization, the steps of:
    comparing the amplitude of the antenna signal generated by the antenna with a predetermined threshold value; and
    detecting the oscillation of the piezo element if the amplitude of the antenna signal is greater than the threshold value.

18. The method according to claim 17, further comprising the step of:
    comparing the amplitude of the oscillation with a predetermined threshold value; and,
    if the amplitude of the oscillation is greater than the threshold value, determining a running time as difference between the moment when the amplitude of the oscillation is greater than the associated threshold value and the moment when the amplitude of the antenna signal is greater than the associated threshold value, and generating a localization signal from the running time.

* * * * *